United States Patent
Leman et al.

(10) Patent No.: US 6,771,516 B1
(45) Date of Patent: Aug. 3, 2004

(54) METHOD AND APPARATUS FOR FASTENING CIRCUIT BOARDS TO COMPUTER CHASSIS

(75) Inventors: Michael V. Leman, Eagle, ID (US); Gregory P. Johnson, Boise, ID (US); R. Doug Smith, Caldwell, ID (US); Craig L. Boe, Nampa, ID (US); Jacques Gagne, Los Altos, CA (US); Philip Hartley, Washington, DC (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/472,725

(22) Filed: Dec. 27, 1999

(51) Int. Cl.[7] .............................. H02B 1/24; H05K 7/02; H05K 7/14
(52) U.S. Cl. ........................ 361/825; 361/829; 361/801; 361/808; 361/809; 174/52.1
(58) Field of Search .................... 361/752, 807, 361/808, 809, 796, 801, 802, 810, 825, 829, 826; 174/52.1

(56) References Cited

U.S. PATENT DOCUMENTS

| | | | |
|---|---|---|---|
| 4,389,759 A | * | 6/1983 | Yuda ........................... 24/214 |
| 4,495,380 A | | 1/1985 | Ryan et al. |
| 4,855,873 A | | 8/1989 | Bhargava et al. |
| 4,901,205 A | | 2/1990 | Landis et al. |
| 5,085,589 A | | 2/1992 | Kan |
| 5,138,529 A | | 8/1992 | Colton et al. |
| 5,218,760 A | | 6/1993 | Colton et al. |
| 5,225,629 A | | 7/1993 | Garrett |
| 5,241,451 A | | 8/1993 | Walburn et al. |
| 5,267,125 A | | 11/1993 | Liu |
| 5,452,184 A | | 9/1995 | Scholder et al. |
| 5,490,038 A | | 2/1996 | Scholder et al. |
| 5,537,294 A | | 7/1996 | Siswinski |
| 5,563,450 A | | 10/1996 | Bader et al. |
| 5,647,748 A | | 7/1997 | Mills et al. |
| 5,691,504 A | * | 11/1997 | Sands et al. .............. 174/35 R |
| 5,707,244 A | | 1/1998 | Austin |
| 5,865,518 A | | 2/1999 | Jarrett et al. |
| 5,973,926 A | * | 10/1999 | Sacherman et al. .......... 361/759 |
| 6,046,912 A | * | 4/2000 | Leman ....................... 361/784 |
| 6,114,626 A | * | 9/2000 | Barnes et al. .............. 174/52.1 |
| 6,362,978 B1 | * | 3/2002 | Boe ........................... 361/825 |
| 6,424,540 B1 | * | 7/2002 | Chen et al. ................. 361/759 |

OTHER PUBLICATIONS

Assy Details–SSS System; Palo Alto Design Group drawing; Apr. 20, 1998.

U.S. patent application Ser. No. 09/472,728, Boe, filed Dec. 27, 1999.

* cited by examiner

*Primary Examiner*—David Martin
*Assistant Examiner*—Dameon E. Levi
(74) *Attorney, Agent, or Firm*—Perkins Coie LLP (57) ABSTRACT

Methods and apparatuses for removably securing one or more computer circuit boards to a computer chassis. In one embodiment, the apparatuses include a bracket having attached sites that can be selectively aligned with corresponding fastening sites of one or more types of printed circuit boards. The circuit boards can be attached to the bracket without tools and without threaded fasteners, and the bracket can be attached to the chassis also without tools and with out threaded fasteners. The circuit boards can be grounded to the chassis solely through a compressible conductive gasket that extends between the chassis and input/output connectors of the printed circuit boards.

21 Claims, 4 Drawing Sheets

METHOD AND APPARATUS FOR FASTENING CIRCUIT BOARDS TO COMPUTER CHASSIS

TECHNICAL FIELD

This invention relates to methods and apparatuses for fastening circuit boards to computer chassis.

BACKGROUND OF THE INVENTION

Computers typically include a chassis that houses semiconductor devices, such as memory chips, processors, and linking circuitry mounted to a printed circuit board. The printed circuit board is typically attached with threaded fasteners to stand-offs, which are then attached to a surface on the chassis, also with threaded fasteners. Accordingly, the stand-offs secure the circuit board to the chassis while leaving a gap between the surface of the circuit board and the surface of the chassis. The gap is typically sized to prevent devices and connecting circuitry mounted on the circuit board from contacting the chassis, which could cause the devices to short-circuit.

One problem with the above design is that it can be time consuming to first threadably attach the stand-offs to each circuit board and then threadably attach each stand-off to the chassis. One approach to address this problem is to attach the circuit board to a plurality of rails with unthreaded fasteners and then attach the rails to the chassis, also with unthreaded fasteners. One such arrangement is an NLX circuit board available from Intel Corp. of Santa Clara, Calif.

The NLX circuit boards, however can also have certain drawbacks. For example, it may be difficult and/or intimidating for end users of the computer to remove the circuit board for service or replacement because tools may be required to remove/fasten the circuit board to the rails and remove/fasten the rails to the chassis. Furthermore, the rails are configured to attach only one type of circuit board to the chassis, and accordingly different rails are required to attach different circuit boards to the chassis. Still further, the circuit board must be properly grounded to the chassis to ensure that the devices on the circuit board share the same ground potential. Accordingly, the fasteners connecting the rails to the chassis and the fasteners connecting the circuit board to the rails are generally conductive to provide a conductive link between the circuit board and the chassis. This feature can increase the cost and/or complexity of the fasteners, and therefore increase the cost of the computer with conventional NLX board configurations.

SUMMARY OF THE INVENTION

The present invention is directed toward methods and apparatuses for removably securing printed circuit boards to a computer chassis. In one aspect of the invention, the apparatus can include a bracket for supporting a first computer circuit board or a second computer circuit board relative to the computer chassis. The bracket can include a bracket body having a first arrangement of bracket fastening sites aligned with attachment sites of the first computer circuit board, and a second arrangement of bracket fastening sites aligned with the attachment sites of the second computer circuit board. The apparatus can further include at least one circuit board fastener having a bracket coupling portion coupleable to one of the bracket fastening sites and a board coupling portion aligned with and configured to couple to one of the attachment sites of the first circuit board when the circuit board fastener is coupled to a bracket fastening site of the first arrangement. The board coupling portion is aligned with and configured to couple to an attachment site of the second circuit board when the circuit board fastener is coupled to a bracket fastening site of the second arrangement. The apparatus still further includes at least one chassis fastener coupled to the bracket body and positioned to couple to a corresponding fastening site of the computer chassis to support the bracket body and either the first or the second circuit board relative to the chassis.

In one particular aspect of the invention, the circuit board fasteners are unthreaded and can include first flexible prongs configured to removably engage the circuit board without the use of tools, and second flexible prongs configured to removably engage the chassis without the use of tools. The apparatus can still further include an electrically conductive gasket coupled between the attachment bracket and the chassis to provide the sole electrical path between the chassis and a grounding terminal of a circuit element on the circuit board.

The present invention is also directed toward a method for coupling a computer circuit board to a computer chassis. The method can include coupling the computer circuit board to a support bracket by attaching the computer circuit board, without threaded fasteners, to a plurality of unthreaded bracket fastening sites positioned on first and second transverse support members of the support bracket. The method can further include coupling the support bracket to the computer chassis by attaching the support bracket to at least one unthreaded fastening site of the chassis, also without threaded fasteners. The method can still further include grounding the circuit board by clamping a compressible conductive gasket between the chassis and a mounting plate of the circuit board.

DETAILED DESCRIPTION

The present disclosure describes methods and apparatuses for mounting circuit boards to computer chassis. Many specific details of certain embodiments of the invention are set forth in the following description and in FIGS. 1–5 to provide a thorough understanding of these embodiments. One skilled in the art, however, will understand that the present invention may have additional embodiments, and the invention may be practiced without several of the details described in the following description.

Figure 1:
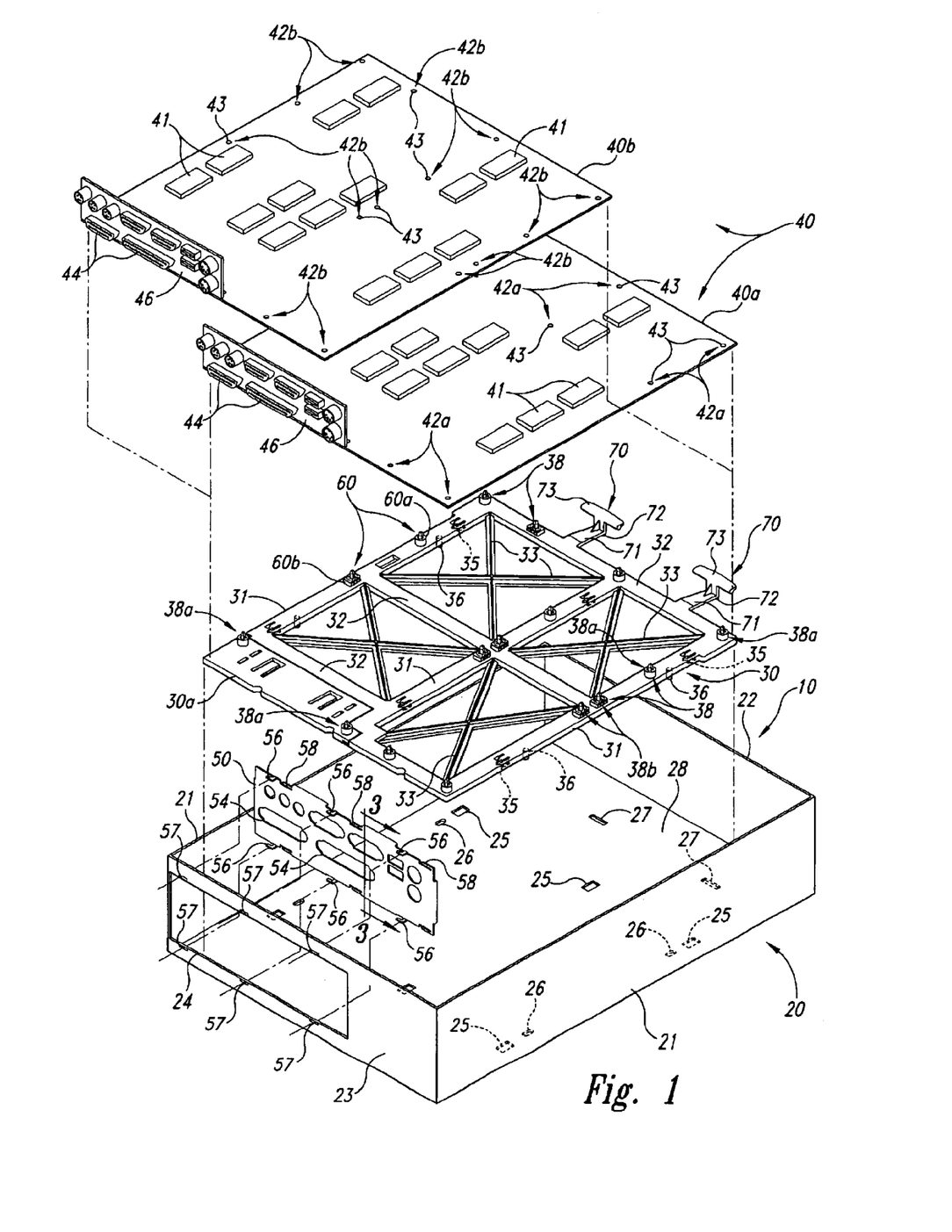
FIG. 1 is an exploded isometric view of a computer assembly having an attachment bracket and a connector gasket for coupling a first or a second circuit board to a chassis in accordance with an embodiment of the invention.

FIG. 1 is an exploded top isometric view of a computer assembly 10 having an attachment bracket 30 that secures one or more types of printed circuit boards 40 to a chassis 20 in accordance with an embodiment of the invention. For purposes of illustration, two types of printed circuit boards are shown in FIG. 1 as a first printed circuit board 40a and a second printed circuit board 40b. The first and second circuit boards 40a and 40b can be approximately the same size, as shown in FIG. 1, or alternatively, the first and second circuit boards can have different sizes. In either embodiment, the attachment bracket 30 is configured to secure one circuit board 40 at a time to the chassis 20. In one aspect of this embodiment, the attachment bracket 30 can be fastened to either type of circuit board 40 and the chassis 20 without using tools. The computer assembly 10 can also include a connector gasket 50 that provides the sole ground connection between the circuit board 40 and the chassis 20, as will be discussed in greater detail below.

In one embodiment, the chassis 20 includes a lower surface 28, opposing sidewalls 21 extending upwardly from the lower surface 28, and a front wall 22 and rear wall 23 extending between the sidewalls 21. The chassis can also include a removable cover (not shown). In other embodiments, the chassis 20 can have a rounded, non-rectilinear configuration or other configurations that removably receive the circuit boards 40.

Each circuit board 40 includes several circuit devices 41 coupled to several input/output connectors 44 with circuitry on the surfaces or embedded in each circuit board 40. The first circuit board 40a includes a plurality of first attachment sites 42a arranged in a first pattern, and the second circuit board 40b includes a plurality of second attachment sites 42b arranged in a second pattern different than the first pattern. In the embodiment shown in FIG. 1, the positions of the first attachment sites 42a form a subset of the positions of the second attachment sites 42b so that the positions of the first attachment sites 42a are common to both the first circuit board 40a and the second circuit board 40b. In one aspect of this embodiment, the attachment sites 42a and 42b include attachment apertures 43 for coupling to the attachment bracket 30 in a manner discussed in greater detail below. Alternatively, the attachment sites 42a and 42b can include other attachment elements, such as slots or protrusions, that can also be coupled to the attachment bracket 30.

In one embodiment, the attachment bracket 30 includes two or more longitudinal members 31 connected to two or more transverse members 32 positioned in the same plane as the longitudinal members 31. The attachment bracket 30 can further include diagonal members 33 extending between the longitudinal members 31 and the transverse members 32 to stiffen the attachment bracket 30. Bracket attachment sites 38 are positioned along the longitudinal members 31 and the transverse members 32 and aligned with at least some of the attachment sites 42a and 42b of the circuit boards 40. For example, in one embodiment, the attachment bracket 30 can include first bracket fastening sites 38a aligned with the first attachment sites 42a of the first circuit board 40a and some of the second attachment sites 42b of the second circuit board 40b, and second bracket fastening sites 38b aligned with the remaining second attachment sites 42b of the second printed circuit board 40b. In one aspect of this embodiment, the bracket fastening sites 38 include an aperture configured to receive a circuit board fastener 60 in a single position for coupling the printed circuit boards 40 to the attachment bracket 30, as will be discussed in greater detail below with reference to FIG. 2. Alternatively, the bracket fastening sites 38 can include other arrangements, as will be discussed in greater detail below with reference to FIG. 5.

In one embodiment, the attachment bracket 30 includes chassis fasteners 35 projecting from the underside of the attachment bracket 30 to fasten the attachment bracket 30 to the chassis 20. Guide members 36 also project from the underside of the attachment bracket 30 to guide the attachment bracket 30 into alignment with the chassis 20. The chassis fasteners 35 are received in corresponding chassis fastener apertures 25 positioned in the lower surface 28 of the chassis 20, and the guide members 36 are received in corresponding guide slots 26 in the lower surface 28, as will be discussed in greater detail below with reference to FIG. 2. The attachment bracket 30 can also include bracket handles 70 that users grasp to removably secure the attachment bracket 30 to the chassis 20, as will also be discussed in greater detail below with reference to FIG. 2.

Figure 2:
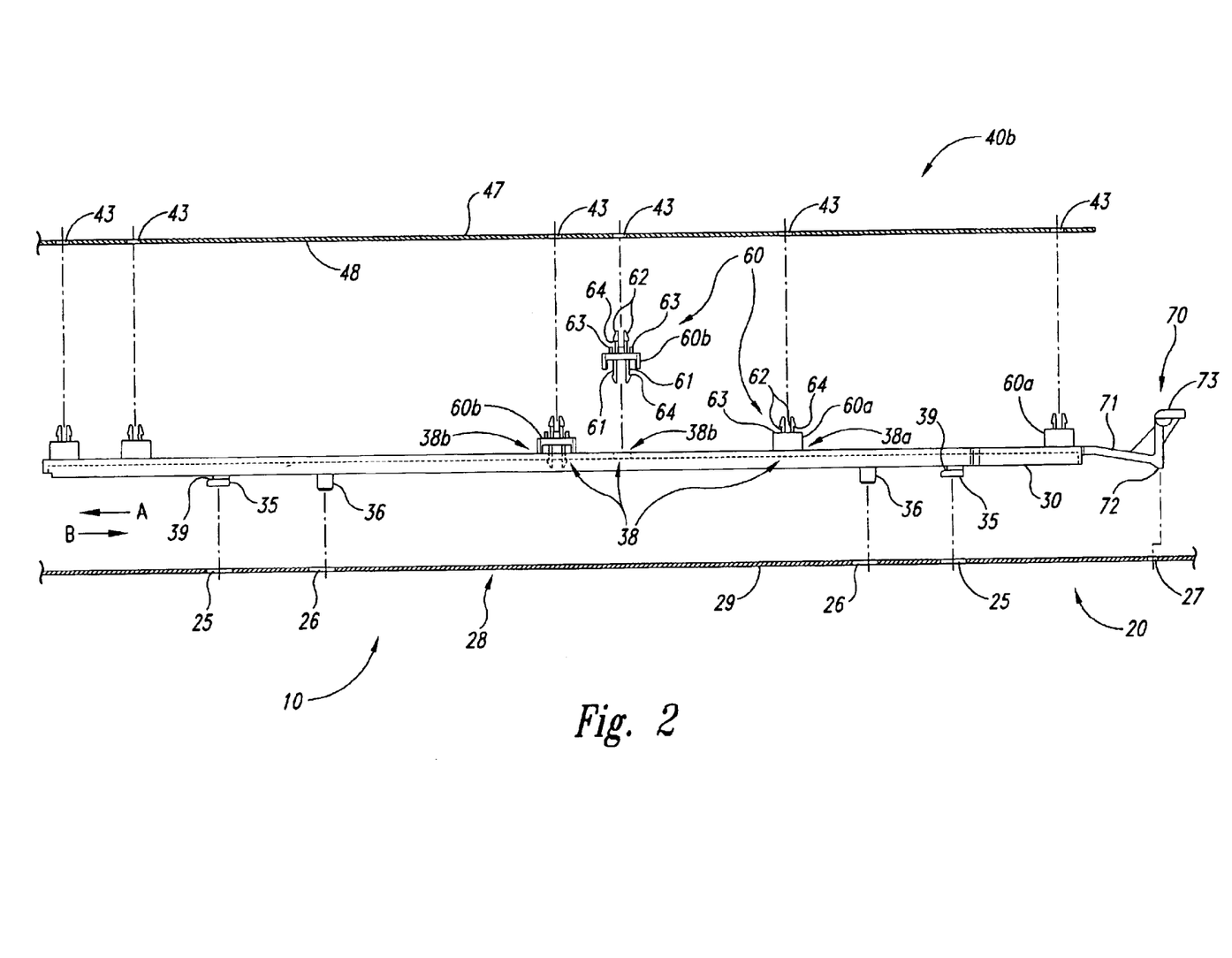
FIG. 2 is a partially exploded, partial cross-sectional side elevation view of a portion of the attachment bracket and computer chassis shown in FIG. 1.

FIG. 2 is an exploded cross-sectional side elevation view illustrating of a portion of the computer assembly 10 shown in FIG. 1 in greater detail. In one embodiment, the circuit board fasteners 60 of the computer assembly 10 include fixed fasteners 60a that are permanently attached to the attachment bracket 30 and removable fasteners 60b that are releasably attached to the attachment bracket 30. In one aspect of this embodiment, the fixed circuit board fasteners 60a are coupled to bracket fastening sites 38 that are common to both the first circuit board 40a (FIG. 1) and the second circuit board 40b. The removable circuit board fasteners 60b are coupled to bracket fastening sites 38 that are aligned with circuit board attachment sites 42 specific to either the first circuit board 40a or the second circuit board 40b. For example, the removable circuit board fasteners 60b shown in FIG. 2 are coupled to the second bracket fastening sites 38b and are aligned with those second attachment sites 42b of the second circuit board 40b that are not common to both the first circuit board 40a and the second circuit board 40b. Accordingly, the removable circuit board fasteners 60b can be selectively attached to (or detached from) a particular bracket 30 depending upon whether the particular bracket 30 supports the first circuit board 40a or the second circuit board 40b. In other embodiments, the arrangement of fixed circuit board fasteners 60a and removable circuit board fasteners 60b can be different, depending on the configuration of the circuit boards 40.

Each of the fasteners 60 can include circuit board projections or prongs 62 that extend through the attachment apertures 43 of the second circuit board 40b. In one aspect of this embodiment, each of the circuit board prongs 62 includes a downwardly-facing lip 64 that faces toward an upwardly-facing shoulder 63 of the circuit board fastener 60. When the circuit board prongs 62 are inserted into the attachment apertures 43, the lip 64 engages an upper surface 47 of the circuit board 40b and the shoulder 63 engages a lower surface 48 of the circuit board to restrict vertical motion of the circuit board 40b relative to the circuit board fastener 60. The sides of the circuit board prongs 62 engage the walls of the apertures 43 to restrict lateral motion of the circuit board 40b relative to the circuit board fastener 60. The circuit board prongs 62 can engage the apertures 43 of the first circuit board 40a (FIG. 1) in a similar manner. Each removable circuit board fastener 60b further includes bracket projections or prongs 61 that are inserted into corresponding bracket fastening sites 38 of the attachment bracket 30 (in a similar manner to that discussed above with reference to the circuit board prongs 62) to restrict vertical and lateral motion of the circuit board fastener 60 relative to the attachment bracket 30.

In one embodiment, the circuit board fasteners 60 are initially fastened to the attachment bracket 30, and then the circuit board 40b is attached to the circuit board fasteners 60 to secure the circuit board 40b to the attachment bracket 30.

Alternatively, the circuit board fasteners 60 can initially be attached to the circuit board 40b, and then the assembly of the circuit board 40 and fasteners 60 can be attached to the attachment bracket 30. In either embodiment, the attachment bracket 30 is coupled to the chassis 20 by aligning each guide member 36 with a corresponding guide slot 26 of the chassis 20 and aligning each chassis fastener 35 with a corresponding chassis fastener aperture 25. The attachment bracket 30 is then lowered toward the lower surface 28 of the chassis 20 until the guide members 36 project at least partially into the guide slots 26 and the chassis fasteners 35 project through the chassis fastener apertures 25. In one aspect of this embodiment, the attachment bracket 30 is further lowered until an upward-facing surface 39 of the chassis fastener 35 is positioned beneath a downward-facing surface 29 of the chassis lower surface 28. The attachment bracket 30 is then moved from right to left as indicated by arrow "A" to slide the upward-facing surface 39 of the chassis fastener 35 a short distance along the downward-facing surface 29 of the chassis 20. Accordingly, the chassis fasteners restrict vertical motion of the attachment bracket 30 relative to the chassis 20.

In one embodiment, the attachment bracket 30 and the second circuit board 40b can be positioned generally parallel to the lower surface 28 of the chassis 20 and lowered as a unit toward the lower surface 28. Alternatively, the left end (as seen in FIG. 2) of the attachment bracket 30 can be lowered first to align the guide members 36 and the chassis fasteners 35 toward the left end of the attachment bracket 30 before aligning the guide members 36 and the positioned chassis fasteners 35 positioned toward the right side of the attachment bracket 30.

In either of the above methods for coupling the attachment bracket 30 to the chassis 20, the user can grasp the attachment bracket 30 by the bracket handles 70. Accordingly, each bracket handle 70 can include a grip 73 fastened to the attachment bracket 30 with a connecting portion 71. Each bracket handle 70 can further include a downwardly projecting tab 72 that faces toward the lower surface 28 of the chassis 20 and projects below the bottom surface of the attachment bracket 30. As the attachment bracket 30 is moved from left to right (as indicated by arrow A), the connecting portion 71 biases the tab 72 into a corresponding tab aperture 27 in the lower surface 28 of the chassis 20 to further secure the attachment bracket 30 to the chassis 20. To remove the attachment bracket 30 and the circuit board 40a from the chassis 20, the user lifts up on the grips 73 of the bracket handles 70 to remove the tabs 72 from the tab apertures 27 and then slides the attachment bracket 30 from left to right as indicated by arrow "B" to disengage the chassis fasteners 35 from the lower surface 28 of the chassis 20. Once the chassis fasteners 35 are disengaged, the user can lift the attachment bracket 30 out of the chassis 20.

One feature of an embodiment of the computer assembly 10 discussed above with reference to FIGS. 1 and 2 is that the circuit boards 40 can be easily coupled to and removed from the chassis 20 without the use of tools. For example, users and/or manufacturers can manually couple the circuit board fasteners 60 to the attachment bracket 30 and then fasten the circuit board 40 to the circuit board fasteners 60 without using tools. The attachment bracket 30 and the circuit board 40 can then be attached to or removed from the chassis 20, also without using tools. This feature can be particularly advantageous to the end user, who can easily remove the circuit board 40 and the attachment bracket 30 from the chassis 20 as a unit. The user can also easily separate the circuit board 40 from the attachment bracket 30. Accordingly, the user can transport the circuit board 40 (with or without the attachment bracket 30) to a service site for servicing or replacement, without transporting the entire chassis 20.

Another feature of the computer assembly 10 is that each circuit board fastener 60 can replace a stand-off and two threaded fasteners that are used in some conventional arrangements. Accordingly, an embodiment of the computer assembly 10 discussed above can simplify inventory control and the assembly of custom computers because it reduces the number of parts required to couple circuit boards 40 to the chassis 20.

Still another feature of the computer assembly 10 shown in FIGS. 1 and 2 is that the attachment bracket 30 is a single unit, unlike some conventional arrangements in which a plurality of rails couple circuit boards to computer chassis. Furthermore, the same attachment bracket 30 can be used to couple several different types of circuit boards 40 to the same type of chassis. Accordingly, an embodiment of the computer assembly 10 can further reduce the number of parts required to couple one or more types of circuit boards 40 to the chassis 20.

Yet another feature of an embodiment of the computer assembly 10 is that the attachment bracket 30 extends in two transverse directions. For example, the transverse members 32 and the diagonal members 33 extend transverse to the longitudinal members 31. Accordingly, the attachment bracket 30 can provide more support to the circuit board 40 than some conventional arrangements in which parallel rails couple the circuit board 40 to the chassis 20. An advantage of the transverse support is that the circuit board 40 can be less likely to sag, which can cause damage to the circuit board 40 and/or the circuit devices 41.

In an alternate embodiment, the removable circuit board fasteners 60b can be attached to the attachment bracket 30 without the use of tools, and a compression tool can be used to fasten the circuit board 40 to the circuit board fasteners 60. For example, the compression tool can include a jig (not shown) having a plurality of pistons (not shown) that hydraulically or pneumatically force the circuit board 40 into engagement with the circuit board fasteners 60. This automated or partially automated approach may be suitable when the force required to press the circuit board 40 onto the circuit board fasteners 60 is too large to be practical for a manual operation, for example, when a large number of circuit board fasteners 60 are coupled to the circuit board 40.

Referring to FIG. 1, the connector gasket 50 provides a ground connection between the circuit board 40 and the chassis 20. In one embodiment, each circuit board 40 includes an internal ground plane (not visible in FIG. 1) coupled to ground terminals of the circuit devices 41. The ground plane is coupled to a conductive mounting plate 46 that supports the connectors 44. The connector gasket 50 fits between the mounting plate 46 and the rear wall of the chassis 20 to electrically couple the ground plane to the chassis 20. The connector gasket 50 includes connector gasket apertures 54 aligned with the connectors 44 of the circuit board 40 and aligned with a corresponding chassis connector aperture 24 of the chassis 20. When the circuit board 40 is mounted to the attachment bracket 30, and the attachment bracket 30 is mounted to the chassis 20, the connector gasket 50 is clamped between the mounting plate 46 and the rear wall 23 so that the connectors 44 project through the gasket apertures 54 and the connector aperture 24.

In one embodiment, the gasket 50 can include hooks 56 that are received in corresponding hook slots 57 in the rear wall 23 of the chassis 20. In one aspect of this embodiment, the hooks 56 and the hook slots 57 can be arranged so that the gasket 50 can be attached to the chassis 20 in only one orientation to prevent the gasket 50 from being misaligned. In a further aspect of this embodiment, the gasket 50 can also include dimples 58 biased against the inner surface of the chassis 20 to restrict motion of the gasket 50 relative to the chassis 20 once the gasket 50 is installed.

In an alternative arrangement, the computer assembly 10 can include additional grounding connections to supplement the connection provided by the connector gasket 50. For example, a corner portion 30a of the attachment bracket 30 (which has two bracket fastening sites 38a and two fixed circuit board fasteners 60a) can be removed from the attachment assembly 30. Two conductive stand-offs (not shown) can be coupled at the bracket fastening sites 30a between the circuit board 40 and the chassis 20, either with or without threaded fasteners. Accordingly, the conductive standoffs can provide a supplemental grounding path between the circuit board 40 and the chassis 20.

Figure 3:
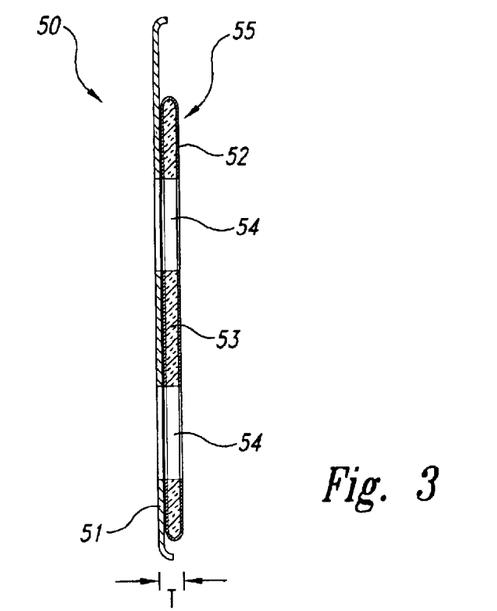
FIG. 3 is a cross-sectional view of the connector gasket shown in FIG. 1.

FIG. 3 is a cross-sectional view of the connector gasket 50 taken substantially along lines 3—3 of FIG. 1. In one embodiment, the connector gasket 50 includes a conductive plate 51 that supports a compressible gasket 55. In one aspect of this embodiment, the compressible gasket 55 includes a conductive fabric 52 attached to the conductive plate 51 and wrapped around a layer of compressible foam 53. An overall thickness "T" of the connector gasket 50 is slightly larger than the gap between the mounting plate 46 (FIG. 1) and the rear wall 23 (FIG. 1) of the chassis 20 (FIG. 1) when the attachment bracket 30 is attached to the chassis 20. Accordingly, the compressible gasket 55 is compressed between the mounting plate 46 and the rear wall 23 to provide a secure electrical contact between the connector plate 46 and the rear wall 23.

In other embodiments, the connector gasket 50 can have other arrangements. For example, the compressible foam 53 can be replaced with one or more leaf springs or coil springs that also provide a secure electrical contact between the mounting plate 46 and the back wall 23 of the chassis 20. In either embodiment, an advantage of the connector gasket 50 is that it can provide an electrical grounding contact between the circuit board 40 and the chassis 20. Accordingly, none of the other physical connections between the circuit board 40 and the chassis 20 need to be electrically conductive. For example, the circuit board fasteners 60, the guide members 36, the chassis fasteners 35, and the bracket handle 70 and tab 72 can all be formed from dielectric materials (such as plastics) because the connector gasket 50 provides the electrical connection between the circuit board 40 and the chassis 20. As a result, the foregoing dielectric components (with the exception of the removable circuit board fasteners 60b) can be formed integrally with the attachment bracket 30 using an injection molding process or other suitable processes.

Figure 4:
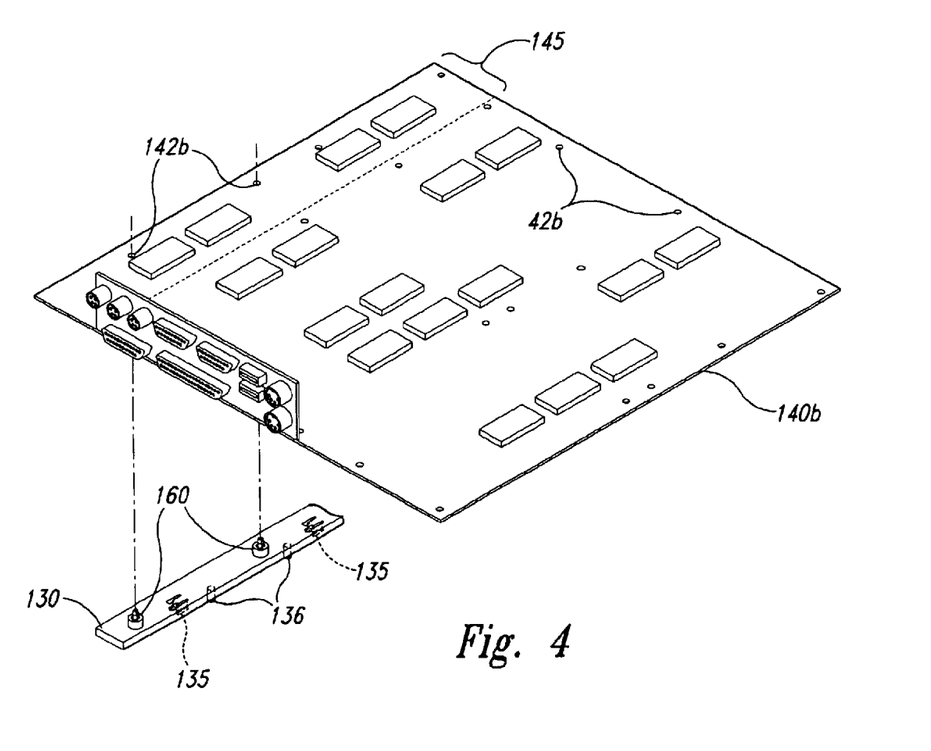
FIG. 4 is an exploded top isometric view of an attachment bracket and circuit board in accordance with another embodiment of the invention.

FIG. 4 is a partially exploded, top isometric view of a circuit board 140b and a supplemental attachment bracket 130 in accordance with another embodiment of the invention. In one aspect of the embodiment shown in FIG. 4, the circuit board 140b includes an extension portion 145 which gives the circuit board 140b a larger footprint or planform shape than that of either of the circuit boards 40a or 40b shown in FIG. 1. The extension portion 145 can include attachment sites 142b that are removably attached to circuit board fasteners 160 of the supplemental attachment bracket 130. The circuit board fasteners 160 can be either permanently fixed to the supplemental attachment bracket 130 or removably fixed to the attachment bracket 130 in a manner similar to that discussed above with reference to FIG. 2. The supplemental attachment bracket 130 can also include chassis fasteners 135 and guide members 136 that engage corresponding apertures of a chassis (not shown), also in a manner generally similar to that discussed above with reference to FIG. 2.

In one embodiment, the circuit board 140b can be attached to a chassis generally similar to the chassis 20 shown in FIG. 1 with both the supplemental attachment bracket 130 and the attachment bracket 30 (FIG. 1). An advantage of this arrangement is that the supplemental attachment bracket 130 can provide additional s support for the extension portion 145 of the circuit board 140b to prevent the extension portion 145 from directly contacting the chassis, which night short-circuit devices on the extension portion 145. Accordingly, the attachment bracket 30 can support circuit boards 140 of the type shown in FIG. 1 in addition to the circuit boards 40 of the type shown in FIG. 1 by supplementing the attachment bracket 30 with the supplemental attachment bracket 130.

Figure 5:
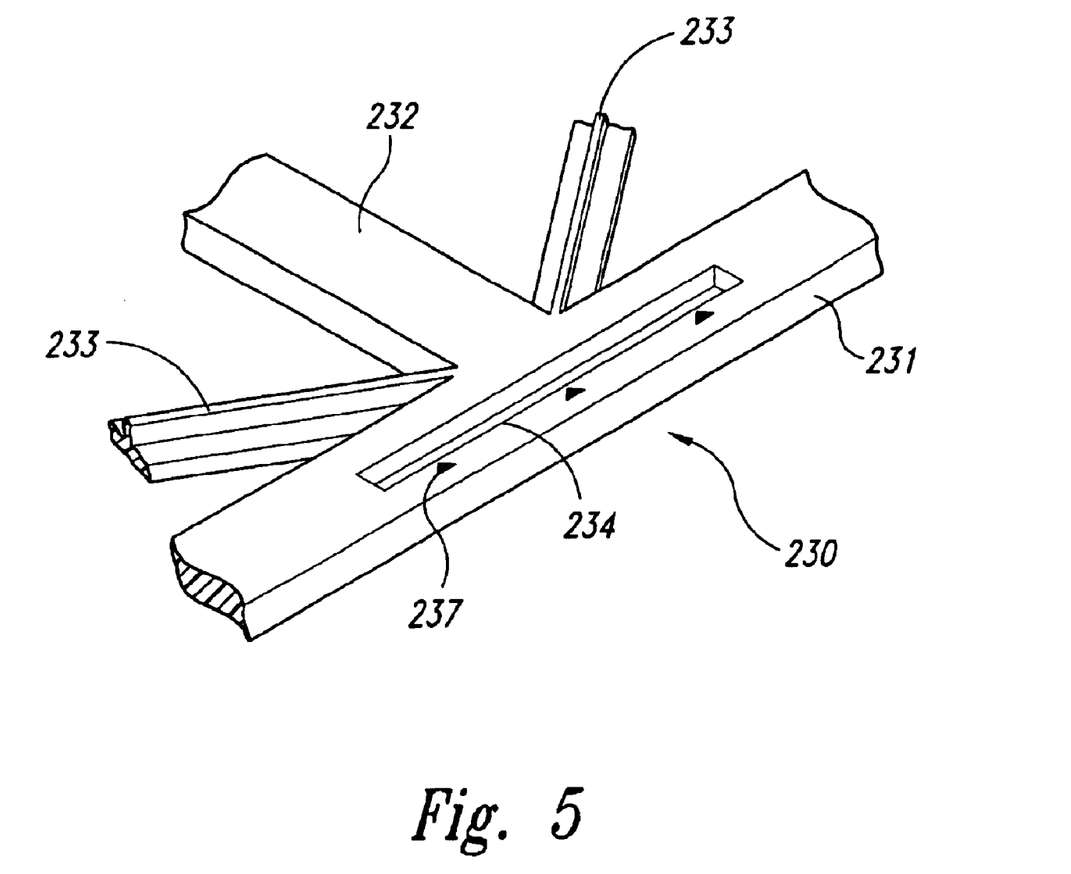
FIG. 5 is a top isometric view of a portion of an attachment bracket having an elongated groove in accordance with still another embodiment of the invention.

FIG. 5 is a top view of an attachment bracket 230 having a bracket aperture 234 in accordance with another embodiment of the invention. The attachment bracket 230 can include a longitudinal member 231, transverse member 232 and diagonal members 233 arranged generally similarly to the arrangement shown in FIG. 1. In one embodiment the bracket aperture 234 includes an elongated groove which can be aligned with one or more of the attachment sites 42 (FIG. 1) of the printed circuit boards 40 (FIG. 1). Accordingly, the circuit board fasteners 60 (FIG. 2) can be positioned at any of a variety of locations along the length of the bracket aperture 234 to align with the corresponding fastening sites 42 of the circuit board 40. In one aspect of this embodiment, the circuit board fasteners 60 are inserted into the aperture 234 and moved longitudinally within the aperture 234 until they are properly aligned. Alternatively, the circuit board fasteners 60 can be first aligned with the appropriate portion of the bracket aperture 234 and then fully inserted into the bracket aperture 234. In a further aspect of this embodiment, the bracket 230 can include one or more alignment markings 237 to aid the installer in properly aligning the circuit board fasteners 60.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A bracket for supporting a first or second computer circuit board relative to a computer chassis, the first computer circuit board having an arrangement of attachment sites different than an arrangement of attachment sites of the second computer circuit board, the bracket comprising:

a bracket body having a first arrangement of bracket fastening sites positioned relative to each other in a manner generally similar to the attachment sites of the first computer circuit board and a second arrangement of bracket fastening sites positioned relative to each other in a manner generally similar to the attachment sites of the second computer circuit board;

at least one circuit board fastener having a bracket coupling portion coupled to one of the bracket fastening sites and a board coupling portion aligned with and configured to couple to one of the attachment sites of the first circuit board when the circuit board fastener is coupled to a bracket fastening site of the first arrangement, or the board coupling portion being aligned with and configured to couple to an attachment site of the second circuit board when the circuit board fastener is coupled to a bracket fastening site of the second arrangement;

the first circuit board when the circuit board fastener is coupled to a bracket fastening site of the first arrangement, or the second circuit board when the circuit board fastener is coupled to a bracket fastening site of the second arrangement; and at least one chassis fastener coupled to the bracket body and positioned to couple to a corresponding fastening site of the computer chassis to support the bracket body and either the first circuit board or the second circuit board relative to the chassis.

2. The bracket of claim 1 wherein the bracket coupling portion of the circuit board fastener is unthreaded and configured to be removably attached to the bracket body without the use of tools, the board coupling portion of the circuit board fastener is unthreaded and configured to be removably attached to the circuit board without the use of tools, and the chassis fastener is unthreaded and configured to be attached to the chassis without the use of tools.

3. The bracket of claim 1 wherein the bracket attachment sites of the bracket body include first apertures and the attachment sites of the second circuit board include second apertures, further wherein the bracket coupling portion of the circuit board fastener is unthreaded and includes first flexible prongs configured to be removably inserted into one of the first apertures of the bracket body without the use of tools and the board coupling portion of the circuit board fastener includes second flexible prongs configured to be removably inserted into one of the second apertures of the second circuit board without the use of tools.

4. The bracket of claim 1 wherein the chassis has an elongated slot extending in a first direction and the bracket body includes a guide member positioned to extend in a second direction transverse to the first direction into the elongated slot of the chassis to guide the bracket body into alignment with the chassis.

5. The bracket of claim 1 wherein the bracket fastening sites include apertures sized to receive the bracket coupling portion of the circuit board fastener.

6. The bracket of claim 1 wherein at least one of the bracket fastening sites includes an elongated groove having a lengthwise dimension greater than a corresponding lengthwise dimension of the bracket connection portion of the board fastener to support the bracket connection portion in a plurality of positions within the groove.

7. The bracket of claim 1, further comprising a bracket handle attached to the bracket body and having a grip portion configured to be engaged by a user to move the bracket body into or out of position relative to the chassis.

8. The bracket of claim 7 wherein the bracket handle has a protrusion extending below a bottom surface of the bracket body, the protrusion sized to be removably received in a corresponding slot of the chassis to secure the bracket body relative to the chassis.

9. The bracket of claim 1 wherein the bracket body includes at least two spaced apart longitudinal members joined with at least two spaced apart transverse members extending between the longitudinal members.

10. The bracket of claim 1 wherein the bracket body is a first bracket body and the second circuit board has a larger planform area than the first circuit board, further comprising a second bracket body couplable to a portion of the second circuit board and the chassis to support the second circuit board relative to the chassis.

11. The bracket of claim 10 wherein the second bracket body includes an elongated member having at least one bracket fastening site aligned with an attachment site of the second computer circuit board and at least one chassis fastener positioned to couple to a fastening site of the computer chassis.

12. An assembly for grounding a circuit board at a single location, comprising:

a circuit board having a plurality of attachment sites and at least one circuit element with a grounding terminal;

an input/output connector coupled to the circuit board and electrically coupled to the grounding terminal of the circuit element; a chassis;

an attachment bracket coupled to the attachment sites of the circuit board with circuit board fasteners and coupled to the chassis with at least one chassis fastener; and an electrically conductive gasket coupled between the connector and the chassis, the gasket providing the sole electrical path between the grounding terminal of the circuit element and the chassis.

13. The assembly of claim 12 wherein at least one of the circuit board fasteners is unthreaded and includes first flexible prongs configured to be removably inserted into an aperture of the circuit board, and the at least one chassis fastener is unthreaded and includes an engaging surface spaced apart from the attachment bracket with the chassis clamped between the attachment bracket and the engaging surface to restrict relative motion between the attachment bracket and the chassis.

14. The assembly of claim 12 wherein the circuit board includes a connector plate supporting the connector and the gasket includes a compressible conductive material positioned between the chassis and the connector plate.

15. A method for mounting different types of computer circuit boards to a single type of computer chassis using a single type of mounting bracket, the method comprising;

coupling a plurality of first circuit board fasteners to a first bracket to define a first fastener arrangement with the first circuit board fasteners aligned with first fastening sites of a first circuit board having a first arrangement;

connecting the first circuit board fasteners to the first fastening sites of the first circuit board and connecting the first bracket to a first computer chassis;

coupling a plurality of second circuit board fasteners to a second bracket generally identical to the first bracket to define a second fastener arrangement with the second circuit board fasteners aligned with second fastening sites of a second circuit board having a second arrangement of fastening sites different than the first arrangement of fastening sites; and connecting the second circuit board fasteners to the second circuit board and connecting the second bracket to a second computer chassis.

16. The method of claim 15 wherein coupling the first circuit board fasteners to the first circuit board includes inserting flexible prongs coupled to the first bracket into corresponding apertures of the first circuit board and biasing the prongs against the first circuit board to restrict motion of the first circuit board relative to the first bracket.

17. The method of claim 15 wherein at least one of the first fastening sites of the first circuit board is aligned with a corresponding one of the second fastening sites of the second circuit board, further comprising permanently attaching one of the first circuit board fasteners to the first bracket and permanently attaching one of the second circuit board fasteners to the second bracket.

18. The method of claim 15, further comprising removably connecting at least one of the first circuit board fasteners to the first bracket without threaded fasteners.

19. A bracket for supporting a first or second computer circuit board relative to a computer chassis, the first computer circuit board having an arrangement of attachment sites different than an arrangement of attachment sites of the second computer circuit board, the bracket comprising:

a bracket body having a first arrangement of bracket fastening sites aligned with the attachment sites of the first computer circuit board and a second arrangement of bracket fastening sites aligned with the attachment sites of the second computer circuit board;

at least one circuit board fastener having a bracket coupling portion removably coupled to one of the bracket fastening sites and a board coupling portion aligned with and configured to couple to one of the attachment sites of the first circuit board when the circuit board fastener is coupled to a bracket fastening site of the first arrangement, or the board coupling portion being aligned with and configured to couple to an attachment site of the second circuit board when the circuit board fastener is coupled to a bracket fastening site of the second arrangement; and at least one chassis fastener coupled to the bracket body and positioned to couple to a corresponding fastening site of the computer chassis to support the bracket body and either the first circuit board or the second circuit board relative to the chassis.

20. A circuit board assembly, comprising:

a computer circuit board having a first number of circuit board attachment sites;

a bracket body having a second number of fastening sites with at least some of the fastening sites aligned with the circuit board attachment sites of the circuit board, the second number being larger than the first number;

a plurality of circuit board fasteners wherein individual circuit board fasteners have a bracket coupling portion coupled to one of the bracket fastening sites aligned with the circuit board fastening sites, and wherein individual circuit board fasteners have a board coupling portion aligned with and coupled to one of the attachment sites of the circuit board; and at least one chassis fastener coupled to the bracket body and positioned to couple to a corresponding fastening site of a computer chassis to support the bracket body and the circuit board relative to the chassis.

21. A method for mounting a computer circuit board to a computer chassis, comprising:

determining whether a circuit board has a first arrangement of fastening sites or a second arrangement of fastening sites different than the first arrangement of fastening sites;

if the circuit board has the first arrangement of fastening sites, coupling a plurality of circuit board fasteners to a bracket to define a first fastener arrangement, with the plurality of circuit board fasteners aligned with the first arrangement of fastening sites of the circuit board;

if the circuit board has the second arrangement of fastening sites, coupling a plurality of circuit board fasteners to the bracket to define a second fastener arrangement, with the plurality of circuit board fasteners aligned with the second arrangement of fastening sites of the circuit board;

connecting the circuit board fasteners to the fastening sites of the circuit board; and connecting the bracket to a computer chassis.

* * * * *